US012538583B2

(12) United States Patent
Solaro et al.

(10) Patent No.: US 12,538,583 B2
(45) Date of Patent: Jan. 27, 2026

(54) DEVICE OF PROTECTION AGAINST ELECTROSTATIC DISCHARGES

(71) Applicant: STMicroelectronics France, Montrouge (FR)

(72) Inventors: Yohann Solaro, Grenoble (FR); Johan Bourgeat, Saint Pierre d'allevard (FR)

(73) Assignee: STMicroelectronics France, Montrouge (FR)

( * ) Notice: Subject to any disclaimer, the term of this patent is extended or adjusted under 35 U.S.C. 154(b) by 362 days.

(21) Appl. No.: 18/232,032

(22) Filed: Aug. 9, 2023

(65) Prior Publication Data
US 2024/0072036 A1    Feb. 29, 2024

(30) Foreign Application Priority Data

Aug. 31, 2022    (FR) .................... FR2208745

(51) Int. Cl.
*H01L 27/02*    (2006.01)
*H10D 18/00*    (2025.01)
*H10D 89/60*    (2025.01)

(52) U.S. Cl.
CPC ........... *H10D 89/60* (2025.01); *H10D 18/251* (2025.01)

(58) Field of Classification Search
CPC ................ H10D 89/60; H10D 18/251

USPC ........................................................ 257/173
See application file for complete search history.

(56) References Cited

U.S. PATENT DOCUMENTS

| 8,841,696 B2 | 9/2014 | Lee et al. |
| 2005/0098830 A1 | 5/2005 | Honjoh et al. |
| 2018/0069111 A1 | 3/2018 | Noh et al. |
| 2020/0098741 A1 | 3/2020 | Zeng |

OTHER PUBLICATIONS

INPI Search Report and Written Opinion for priority application, FR Appl. 2208745, report dated Mar. 30, 2023, 8 pgs.

*Primary Examiner* — Dzung Tran
(74) *Attorney, Agent, or Firm* — Crowe & Dunlevy

(57) ABSTRACT

An electronic device includes a doped semiconductor substrate of a first conductivity type. First and second doped wells are provided, separated from each other by trench isolation, within the doped semiconductor substrate. At least one first region and at least one second region are respectively located in the first and second doped wells, with each first and second region having a doping level higher than a doping level of the first and second doped wells. The trench isolation penetrates into the first and second doped wells and extends laterally between the first region and second region. A third region laterally extends between the first and second doped wells at a location under the insulating trench. The third region has a doping level lower than the doping level of the first and second doped wells.

26 Claims, 3 Drawing Sheets

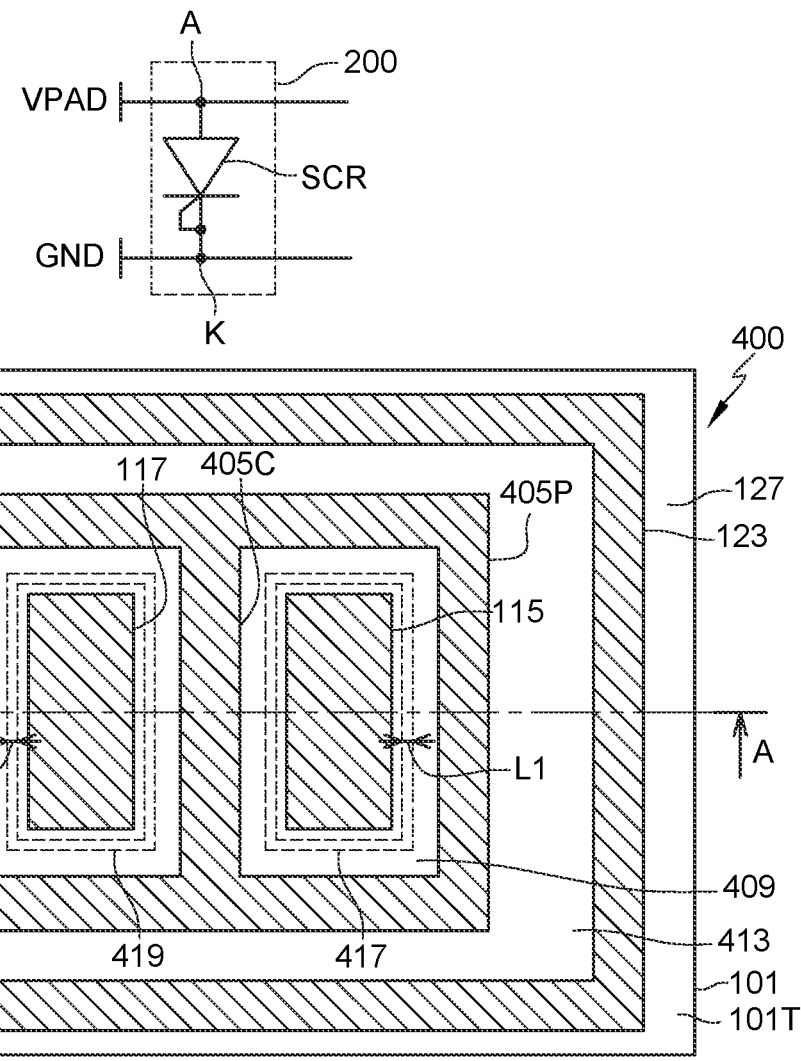
Fig. 3
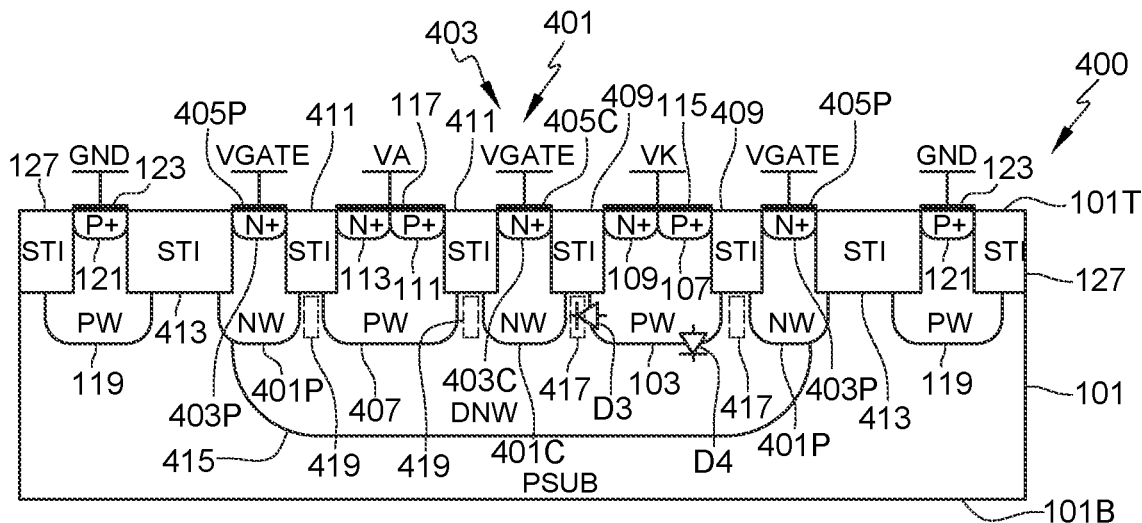
Fig. 4A
Fig. 4B

DEVICE OF PROTECTION AGAINST ELECTROSTATIC DISCHARGES

PRIORITY CLAIM

This application claims the priority benefit of French Application for Patent No. 2208745, filed on Aug. 31, 2022, the content of which is hereby incorporated by reference in its entirety to the maximum extent allowable by law.

TECHNICAL FIELD

The present disclosure generally concerns electronic devices and, more particularly, devices of protection of integrated circuits against electrostatic discharges.

BACKGROUND

A non-protected integrated circuit may undergo, in case of an electrostatic discharge, irreversible deteriorations likely to cause significant malfunctions of the circuit. To overcome this disadvantage, current integrated circuits are generally equipped with protections against electrostatic discharges.

There is a need to improve existing devices of protection of integrated circuits against electrostatic discharges.

It would in particular be desirable to form devices for protecting integrated circuits against electrostatic discharges which are compatible with circuit power supply voltages higher than several volts, or even than several tens of volts, and having a minimum bulk.

There is a need to overcome all or part of the disadvantages of known devices of protection of integrated circuits against electrostatic discharges.

SUMMARY

An embodiment provides an electronic circuit comprising a doped semiconductor substrate of a first conductivity type. Within the doped semiconductor substrate there extend, from a surface of the substrate: first and second separate doped wells, respectively of the first conductivity type and of a second conductivity type, opposite to the first conductivity type, and each having a doping level higher than that of the substrate; at least one first region and at least one second region respectively located in the first and second wells, each having a doping level higher than that of the first and second wells and coupled, preferably connected, respectively to first and second electrodes of the device; an insulating trench penetrating into the first and second wells and extending laterally between said at least one first region and said at least one second region; and a third region laterally extending between the first and second wells, under the insulating trench, and having a doping level lower than that of the first and second wells.

According to an embodiment, the third region vertically extends in the substrate, from a bottom of the insulating trench, down to a depth substantially equal to that of the first and second wells.

According to an embodiment, the third region has a width in the range from 0.26 to 2.5 µm, preferably in the range from 1 to 1.5 µm, more preferably in the order of 1.35 µm.

According to an embodiment, the device comprises exactly two first doped regions respectively of the first and of the second conductivity type.

According to an embodiment, the device comprises exactly two second doped regions respectively of the first and of the second conductivity type.

According to an embodiment, the first and second electrodes are conduction electrodes of the device.

An embodiment provides a device of protection against electrostatic discharges comprising one or a plurality of devices such as described.

According to an embodiment, the device comprises exactly a single second doped region of the second conductivity type.

According to an embodiment, the first and second electrodes are respectively conduction and control electrodes of the device.

According to an embodiment, within the doped semiconductor substrate there further extend, from said surface of the substrate: a third doped well separate from the first and second wells, of the first conductivity type and having a doping level higher than that of the substrate, the first and third wells being located on either side of a central portion of the second well; at least one fourth region located in the third well, having a doping level higher than that of the first well and coupled, preferably connected, to a third conduction electrode of the device; and another insulating trench penetrating into the second and third wells and laterally extending between the second region and said at least one fourth region, the device further comprising a fifth region laterally extending between the second and third wells, under the other insulating trench, and having a doping level lower than that of the second and third wells.

According to an embodiment, within the doped semiconductor substrate there further extend, from said surface of the substrate, a doped peripheral portion of the second well, separate from the first and third wells, of the second conductivity type and having a doping level higher than that of the substrate.

According to an embodiment, the first, second, and third wells are located in a fifth doped well of the second conductivity type and extending in the substrate from said surface.

According to an embodiment: portions of the second well located close to the third well and the third well are located in a fifth doped well of the second conductivity type and extending in the substrate from said surface; and the first well and portions of the second well located close to the first well are not located in the fifth well.

An embodiment provides a device of protection against electrostatic discharges comprising one or a plurality of devices such as described.

According to an embodiment, within the doped semiconductor substrate there further extend, from said surface of the substrate: a sixth doped peripheral well of the first conductivity type and having a doping level higher than that of the substrate; and a seventh doped region located in the sixth well, of the first conductivity type, having a doping level higher than that of the sixth well and connected to a fourth electrode of application of a reference potential.

An embodiment provides an integrated circuit chip comprising one or a plurality of elements, each associated with at least one device such as described.

According to an embodiment, the chip has a power supply voltage greater than 25 V, preferably in the order of 40 V.

BRIEF DESCRIPTION OF THE DRAWINGS

The foregoing and other features and advantages of the present invention will be discussed in detail in the following non-limiting description of specific embodiments in connection with the accompanying drawing, in which:

FIG. 3 is an electric diagram equivalent to the device of FIG. 2;

FIG. 4A is a partial simplified top view of an electronic device according to another embodiment;

FIG. 4B is a cross-section view, along plane AA of FIG. 4A, of the device of FIG. 4A;

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the electronic components or the integrated circuits to be protected against electrostatic discharges are not detailed, the described embodiments being compatible with the components or circuits conventionally protected against electrostatic discharges.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1A:
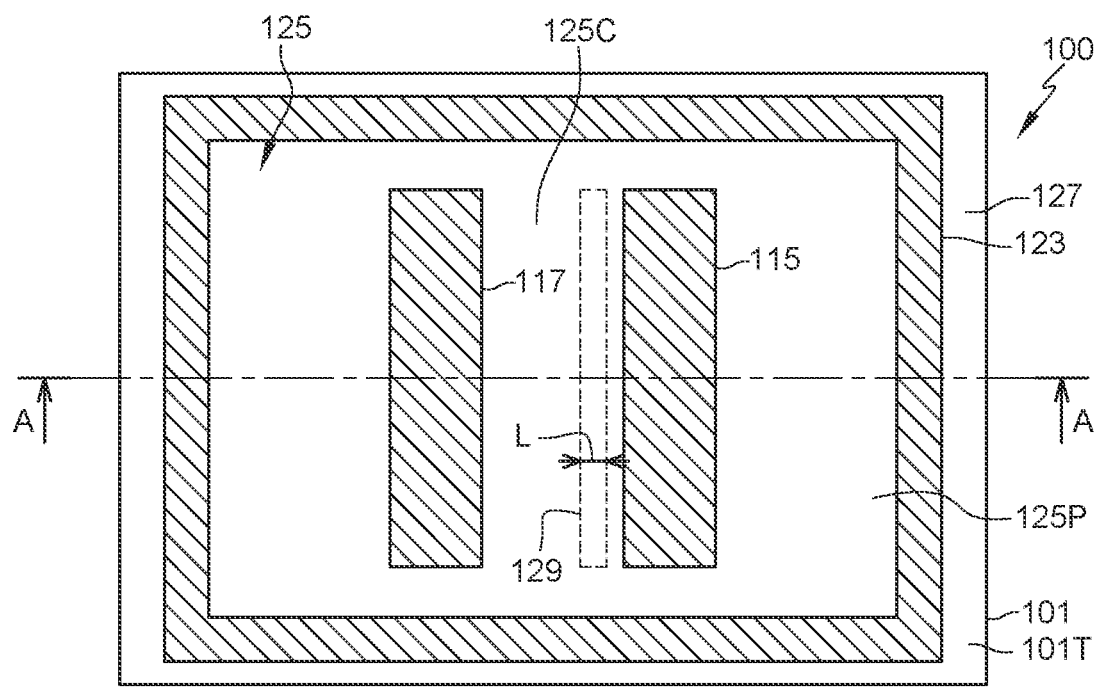
FIG. 1A is a partial simplified top view of an electronic device according to an embodiment.
Figure 1B:
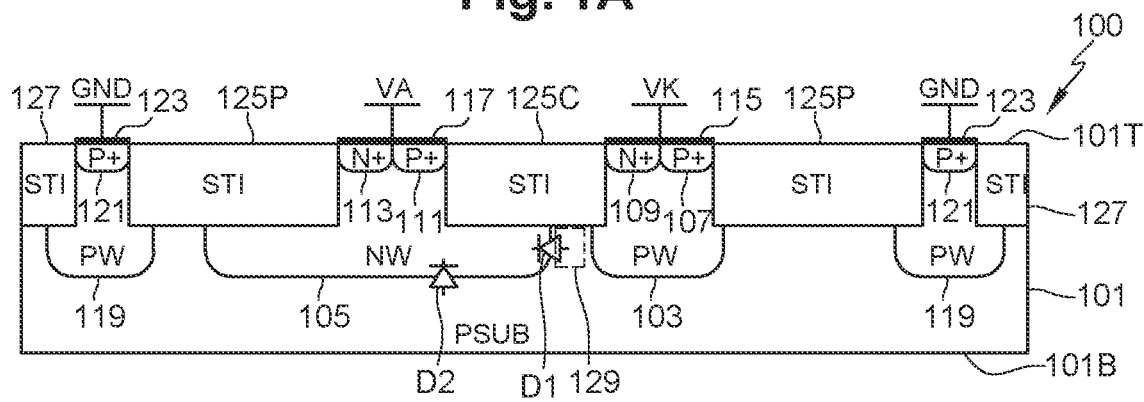
FIG. 1B is a cross-section view, along plane AA of FIG. 1A, of the device of FIG. 1A.

FIG. 1A is a partial simplified top view of an electronic device 100 according to an embodiment. FIG. 1B is a cross-section view, along plane A-A of FIG. 1A, of the device 100 of FIG. 1A.

The device 100 illustrated in FIGS. 1A and 1B is more precisely of thyristor type and is, for example, intended to protect an integrated circuit (not shown) against electrostatic discharges.

In the shown example, device 100 is formed inside and on top of a semiconductor substrate 101 (PSUB). Substrate 101 is, for example, a wafer or a piece of wafer made of a semiconductor material, for example, silicon. As an example, substrate 101 is doped with a first conductivity type, for example, type P.

In the illustrated example, device 100 comprises wells 103 (PW) and 105 (NW), vertically extending into the thickness of semiconductor substrate 101 from a surface 101T of substrate 101 (the upper surface of substrate 101, in the orientation of FIG. 1B). Wells 103 and 105 each have a height, or depth, that is, a dimension measured along a direction orthogonal to surface 101T of substrate 101, smaller than the thickness of substrate 101. In other words, wells 103 and 105 do not emerge on the side of a surface 101B of substrate 101 (the lower surface of substrate 101, in the orientation of FIG. 1B) opposite to surface 101T. As an example, well 103 has a height substantially equal to that of well 105.

According to an embodiment, wells 103 and 105 are separate. In the shown example, wells 103 and 105 each have, in top view, an elongated shape extending along a direction substantially orthogonal to plane AA of FIG. 1A. In this example, wells 103 and 105 are substantially parallel to each other.

In this example, wells 103 and 105 are respectively doped with the first conductivity type (type P, in this example) and with a second conductivity type (type N, in this example), opposite to the first conductivity type. Further, wells 103 and 105 each have a doping level (rate or concentration), higher than that of substrate 101. As an example, wells 103 and 105 each have a doping level in the range from $10^{17}$ at/cm$^3$ to $10^{18}$ at/cm$^3$ (i.e., atoms per cubic centimeter). As an example, well 103 has a doping level substantially equal to that of well 105.

In the shown example, well 103 comprises two regions 107 (P+) and 109 (N+) vertically extending into the thickness of well 103 from surface 101T of substrate 101 down to a depth smaller than that of well 103. In other words, regions 107 and 109 each have a height smaller than that of well 103. Regions 107 and 109 are respectively doped with the first and the second conductivity type (type P and type N, respectively, in this example).

Similarly, well 105 comprises two regions 111 (P+) and 113 (N+) vertically extending into the thickness of well 105 from surface 101T of substrate 101 down to a depth smaller than that of well 105. In other words, regions 111 and 113 each have a height smaller than that of well 105. Regions 111 and 113 are respectively doped with the first and the second conductivity type (type P and type N, respectively, in this example).

In the shown example, regions 107, 109, 111, and 113 each have, in top view, an elongated shape extending along a direction substantially orthogonal to plane AA of FIG. 1A. In this example, regions 107, 109, 111, and 113 are substantially parallel to one another.

Further, regions 107, 109, 111, and 113 each have a doping level higher than that of the well 103, 105 where they are located. As an example, region 107 has a doping level substantially equal to that of region 111, and region 109 has a doping level substantially equal to region 113. Further, regions 107, 109, 111, and 113 may have substantially equal doping levels. As an example, regions 107, 109, 11, and 113 each have a doping level in the range from $10^{21}$ at/cm$^3$ to $10^{22}$ at/cm$^3$.

Although this has not been illustrated, region 107, respectively 111, may be electrically insulated from region 109, respectively 113, by an insulating trench.

Regions 107 and 109 are coupled, preferably connected, to a same electrode 115, coating surface 101T of substrate 101 vertically in line with regions 107 and 109. Similarly, regions 111 and 113 are coupled, preferably connected, to a same electrode 117, distinct from electrode 115, coating surface 101T of substrate 101 vertically in line with regions 111 and 113. Electrodes 115 and 117 are respectively, in this example, conduction electrodes, more precisely cathode or anode electrodes, of thyristor 100. As an example, potentials noted VK and VA are respectively applied to the cathode 115 and to the anode 117 of thyristor 100.

In the illustrated example, thyristor 100 comprises a first gate, or control electrode, corresponding to the region 107 located in well 103 and a second gate corresponding to the region 113 located in well 105. In this example, first and second gates 107 and 113 are respectively connected to the cathode 115 and to the anode 117 of thyristor 100. In other words, the gate 107 and the cathode 115 of thyristor 100 are shorted. Similarly, the gate 113 and the anode 117 of thyristor 100 are shorted. Thyristor 100 is in this case in off mode and is equivalent to a diode comprising a P-N junction having its doped region of the second conductivity type (type N, in this example) formed by regions 111 and 113 and by well 105, due to the connection of region 113 to anode electrode 117, and having its doped region of the first conductivity type (type P in this example) formed by regions 107 and 109 and by well 103, due to the connection of region 107 to cathode electrode 115. Electrodes 115 and 117 respectively correspond, for the diode to which thyristor 100 in off mode is equivalent, to anode and cathode electrodes (while they respectively correspond to the cathode and to the anode of thyristor 100).

In the shown example, device 100 is surrounded with a peripheral well 119 (PW) vertically extending into the thickness of substrate 101 from surface 101T of substrate 101. In this example, peripheral well 119 has, in top view, a ring shape surrounding wells 103 and 105. Wells 103, 105, and 119 are separate. Well 119 has a height smaller than the height of substrate 101. In other words, well 119 does not emerge on the side of surface 101B of substrate 101. As an example, peripheral well 119 has a height substantially equal to that of wells 103 and 105.

Well 119 is, in the shown example, doped with the first conductivity type (type P in this example) and has a doping level greater than that of substrate 101. As an example, the doping level of well 119 is substantially equal to that of wells 103 and 105.

In the shown example, well 119 comprises a region 121 (P+) vertically extending into the thickness of well 119 from surface 101T of substrate 101 down to a depth smaller than that of well 119. In other words, region 121 has a height smaller than that of well 119. Region 121 is doped with the first conductivity type (type P in this example) and has a doping level greater than that of well 119. As an example, region 121 has a doping level substantially equal to that of regions 107 and 111.

In the shown example, region 121 is connected to an electrode 123, coating surface 101T of substrate 110 vertically in line with region 121. Electrode 123 is, in this example, an electrode of application of a reference potential, for example, the ground (GND), of thyristor 100. Electrode 123 has, in top view, a ring shape surrounding the cathode and anode electrodes 115 and 117 of thyristor 100.

In the illustrated example, an insulating trench 125 (STI), for example, a shallow trench isolation (STI), extends vertically into the thickness of substrate 101 from surface 101T of substrate 101. In this example, insulating trench 125 has a height greater than that of regions 107, 109, 111, 113, and 121 and smaller than that of wells 103, 105, and 119.

In the shown example, insulating trench 125 comprises a central portion 125C laterally extending from region 109 to region 111 and partially penetrating into wells 103 and 105. In this example, the central portion 125C of insulating trench 125 has, in top view, an elongated shape extending along a direction substantially orthogonal to plane AA of FIG. 1A. In this example, the central portion 125C of insulating trench 125 is substantially parallel to regions 109 and 111.

Insulating trench 125 further comprises, in the shown example, a peripheral portion 125P having, in top view, a ring shape surrounding regions 107, 109, 111, and 113 and the central portion 125C of insulating trench 125. In this example, the peripheral portion 125P of insulating trench 125 laterally extends, from the structure formed by regions 107, 109, 111, and 113 and by central portion 125C, all the way to 121. Peripheral portion 125P partially penetrates into wells 103, 105, and 119.

In the shown example, another peripheral insulating trench 127 (STI), for example a shallow trench isolation, extends vertically into the thickness of substrate 101 from surface 101T of substrate 101. Insulating trench 127 has, for example, a height greater than that of regions 107, 109, 111, 113, and 121 and smaller than that of wells 103, 105, and 119. As an example, insulating trench 127 has a height substantially equal to that of insulating trench 125.

Peripheral insulating trench 127 has, in top view, a ring shape surrounding region 121 and partially penetrating into peripheral well 119.

According to an embodiment, device 100 further comprises a region 129 laterally extending between wells 103 and 105, under insulating trench 125, and having a doping level lower than that of wells 103 and 105. Region 129 extends, for example, from a side of well 103 to a side of well 105 located in front. Region 129 fills, for example, the entire space located under the central portion 125C of insulating trench 125 and separating wells 103 and 105. In other words, there is a region (reference 129) of the substrate PSUB which is located laterally between the wells 103 and 105.

In the shown example, region 129 has, in top view, an elongated shape extending along a direction substantially orthogonal to plane AA of FIG. 1A. In this example, region 129 is substantially parallel to regions 107, 109, 111, 113 and to the central portion 125C of insulating trench 125.

As an example, region 129 is doped with the first conductivity type (type P, in this example) and has a doping level (rate or concentration) substantially equal to that of substrate 101. As an example, region 129 has a doping level in the range from $10^{14}$ at/cm$^3$ to $10^{16}$ at/cm$^3$.

Region 129 has, for example, a width L, that is, a dimension measured along a direction parallel to plane AA of FIG. 1A and to surface 101T of substrate 101, in the range from 0.26 to 2.5 μm, preferably in the range from 1 to 1.5 μm, more preferably in the order of 1.35 inn.

Wells 103, 105, and 119 as well as regions 107, 109, 111, 113, and 121 are for example formed in substrate 101 by ion implantation from surface 101T of substrate 101.

In device 100, region 129 and well 105 form a heterojunction symbolized, in FIG. 1B, by a diode D1. In the case where region 129 and well 105 are respectively P-type and N-type doped, diode D1 comprises an anode located on the side of region 129 and a cathode located on the side of well 105.

Further, in device 100, substrate 101 and well 105 form another heterojunction symbolized, in FIG. 1B, by another diode D2. In the case where substrate 101 and well 105 are respectively P-type and N-type doped, diode D2 comprises an anode located on the side of substrate 101 and a cathode located on the side of well 105.

The back voltage (BV) or turn-on voltage of device 100 is, due the presence of lightly-doped region 129 located between wells 103 and 105, advantageously greater than the one that a device similar to device 100 but deprived of region 129 (such as where wells 103 and 105 are, for example, joining each other) would have.

Figure 2:
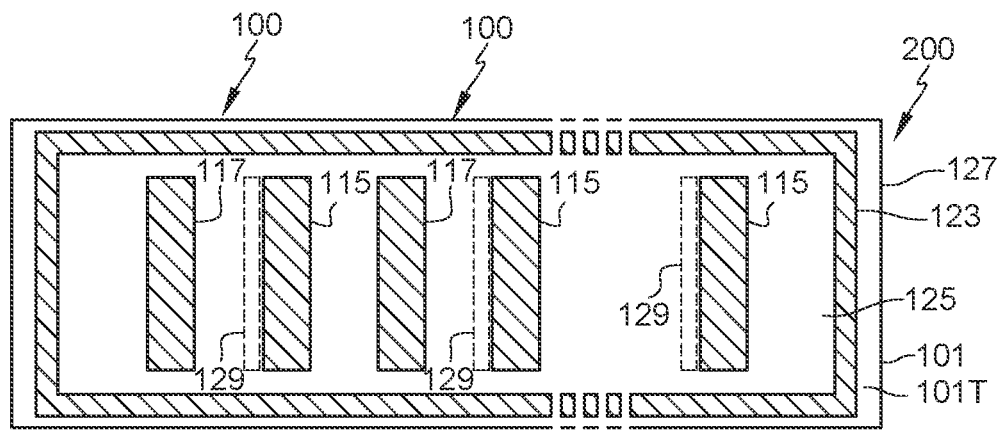
FIG. 2 is a partial simplified top view of a device of protection against electrostatic discharges according to an embodiment.

FIG. 2 is a partial simplified top view of a device 200 of protection against electrostatic discharges according to an embodiment.

In the shown example, device 200 comprises a plurality of devices 100. In device 200, the cathodes 115 of devices 100 are interconnected, for example, by a same conductive track (not shown in FIG. 2), and the anodes 117 of devices 100 are interconnected, for example by a same conductive track (not shown in FIG. 2) different from the conductive track interconnecting the cathodes 115 of devices 100.

The track interconnecting the cathodes 115 of devices 100 is, for example, intended to be connected to a pad or to a node of application of a reference potential GND, for example, the ground, and the track interconnecting the anodes 117 of devices 100 is, for example, intended to be connected to a pad or to a node of application of a positive potential VHV, referenced to potential GND. In case of an electrostatic discharge causing the application of a positive overvoltage between the pad or node of application of potential GND and the pad or node of application of potential VHV, device 200 has an operation similar to that of a diode. However, in case of an electrostatic discharge causing the application of a positive overvoltage between the pad or node of application of potential VHV and the pad or node of application of potential GND, device 200 has an operation similar to that of a thyristor.

In the shown example, device 200 comprises an alternation of cathodes 115 and of anodes 117 surrounded with peripheral electrode 123. Device 200 comprises, for example, between two and ten devices 100, for example, approximately five devices 100.

As an example, device 200 has a surface area of approximately 2,500 μm². As an example, device 200 has a turn-on voltage Vt, in absolute value and in a case where device 200 comprises five devices 100: in the order of 18 V, in a case where the region 129 of each device 100 has a width equal to approximately 0.62 μm; in the order of 24 V, in a case where the region 129 of each device 100 has a width approximately equal to 0.78 μm; and in the order of 47 V, in a case where the region 129 of each device 100 has a width equal to approximately 1.78 inn.

As a comparison, the turn-on voltage Vt of the thyristor of a device which would have a structure and dimensions similar to those of device 200, but deprived of region 129, would be smaller than or equal to approximately 15 V in absolute value. To reach a turn-on voltage equivalent to that of device 200, a plurality of devices deprived of region 129 placed in series would for example be necessary, which would increase the space occupied by the device of protection against electrostatic discharges.

An advantage of device 200 lies in the fact that it enables, for a substantially equivalent turn-on voltage, to decrease by approximately 40% the occupied surface area with respect to one or a plurality of devices associated in series which would have a structure similar to that of device 200 but which would be deprived of region 129.

The turn-on voltage of device 200 is substantially proportional to the width of the region 129 of each device 100. It is thus advantageously possible to adjust the width of each region 129 according to the turn-on voltage desired for device 200.

FIG. 3 is an electric diagram equivalent to the device 200 of FIG. 2.

Device 200 is, in FIG. 3, symbolized by a thyristor SCR substantially equivalent to the parallel association of the P-N junctions of the thyristors formed by the devices 100 comprised by device 200. Thyristor SCR comprises an anode A, for example corresponding to a conductive track interconnecting all the anodes 117 of the devices 100 of device 200, and a cathode K, for example corresponding to another conductive track interconnecting all the cathodes 115 of the devices 100 of device 200.

In the shown example, the cathode K of thyristor SCR is taken to reference potential GND, for example by connection of the conductive track interconnecting the cathodes 115 of devices 100 with electrode 123, and the anode A of thyristor SCR is taken to a bias potential noted VPAD. Potential VPAD corresponds, for example, to a power supply potential of an integrated circuit (not shown in FIG. 3) having a pad coupled or connected to anode A of thyristor SCR of device 200. As an example, potential VPAD is greater than 10 V, for example greater than 25 V, for example in the order of 40 V.

FIG. 4A is a partial simplified top view of an electronic device 400 according to another embodiment. FIG. 4B is a cross-section view, along plane A-A of FIG. 4A, of the device 400 of FIG. 4A.

The device 400 illustrated in FIGS. 4A and 4B is more precisely of triac type and is, for example, intended to protect an integrated circuit (not shown) against electrostatic discharges.

The device 400 of FIGS. 4A and 4B comprises elements common with the device 100 of FIGS. 1A and 1B. These common elements will not be described again hereafter.

The device 400 of FIGS. 4A and 4B differs from the device 100 of FIGS. 1A and 1B in that device 400 comprises a well 401 (NW) vertically extending into the thickness of substrate 101 from surface 101T of substrate 101. Well 401 has a height smaller than the thickness of substrate 101. In other words, well 401 does not emerge on the side of surface 101B of substrate 101. As an example, well 401 has a height substantially equal to that of well 103 (PW).

In this example, well 401 is doped with the second conductivity type (type N, in this example). Further, well 401 has a doping level higher than that of substrate 101 (PSUB). As an example, well 401 has a doping level in the range from $10^{17}$ at/cm³ to $10^{18}$ at/cm³.

In the shown example, device 400 comprises a region 403 (N+) vertically extending into the thickness of well 401 from surface 101T of substrate 101 down to a depth smaller than that of well 401. In other words, region 403 has a height smaller than that of well 401. Region 403 is doped with the second conductivity type (type N in this example) and has a doping level greater than that of well 401. As an example, region 403 has a doping level in the range from $10^{21}$ at/cm³ to $10^{22}$ at/cm³.

Region 403 is coupled, preferably connected, to an electrode 405 coating surface 101T of substrate 101 vertically in line with region 403. Electrode 403 is, in this example, a control electrode, or gate, of triac 400, having a control potential node VGATE. In practice, potential VGATE may be left floating, that is, electrode 403 is intended to be connected to no control node.

According to an embodiment, wells 103 and 401 are separate. In the shown example, well 401 comprises a central portion 401C interposed between well 103 and a well 407 (PW) having regions 111 (P+) and 113 (N+) connected to electrode 117 located therein. Well 407 differs, for example, from well 105 in that well 407 is doped with the first conductivity type (type P, in this example).

In this example, the central portion 401C of well 401 has, in top view, an elongated shape extending along a direction substantially orthogonal to plane AA of FIG. 4A. In this example, the central portion 401C of well 401 is substantially parallel to wells 103 and 407.

In the shown example, well 401 further comprises a peripheral portion 401P having, in top view, a ring shape surrounding regions 107 (P+), 109 (N+), 111 (P+), and 113 (N+) and the central portion 401C of well 401.

Similarly, region 403 and electrode 405 each comprise a central portion 403C, 405C, interposed between electrodes 115 and 117, and a peripheral portion 403P, 405P having, in top view, a ring shape surrounding electrodes 115 and 117.

In the illustrated example, insulating trenches 409 (STI), 411 (STI), and 413 (STI), for example, shallow insulating trenches, vertically extend into the thickness of substrate 101 from surface 101T of substrate 101. In this example, insulating trenches 409, 411, and 413 each have a height greater than that of regions 107, 109, 111, 113, 121 (P+), and 403 and smaller than that of wells 103, 119 (PW), 401, and 407. As an example, each insulating trench 409, 411, 413 has a height substantially equal to that of peripheral insulating trench 127 (STI).

Although this has not been illustrated, region 107, respectively 111, may be electrically insulated from region 109, respectively 113, by an insulating trench.

In the shown example, insulating trench 409 has, in top view, a ring shape surrounding regions 107 and 109. In this example, insulating trench 409 extends laterally from regions 107 and 109 to sides of portions of region 403 which surround regions 107 and 109.

Similarly, insulating trench 411 has, in top view, a ring shape surrounding regions 111 and 113. In this example, insulating trench 411 extends laterally from regions 111 and 113 to sides of portions of region 403 which surround regions 111 and 113.

In the shown example, insulating trench 413 has, in top view, a ring shape surrounding region 403. In this example, the insulating trench 413 extends laterally from region 403 to peripheral region 121 (P+) located in peripheral well 119.

In the shown example, wells 103, 401, and 407 are located in another well 415 (DNW) vertically extending into the thickness of substrate 101 from surface 101T of substrate 101. Well 415 has a height greater than that of wells 103, 401, and 407 and smaller than the thickness of substrate 101. In other words, well 415 does not emerge on the side of surface 101B of substrate 101.

In this example, well 415 is doped with the second conductivity type (type N, in this example) and has, for example, a doping level substantially equal to that of substrate 101.

According to an embodiment, device 400 further comprises a region 417 laterally extending between wells 103 and 401, under insulating trench 409, and having a doping level smaller than that of wells 103 and 401. As an example, region 417 has a doping level in the range from $10^{14}$ at/cm$^3$ to $10^{16}$ at/cm$^3$. Region 417 extends, for example, laterally from the sides of well 103 to the sides of well 401 located in front thereof. In other words, region 417 fills, for example, the entire space located under insulating trench 409 and separating well 103 from well 401. In the shown example, region 417 has, in top view, a ring shape surrounding well 103.

Similarly, device 400 further comprises another region 419 laterally extending between wells 407 and 401, under insulating trench 411, and having a doping level lower than that of wells 407 and 401. Region 419 laterally extends, for example, from the sides of well 407 to the sides of well 401 located in front thereof. In other words, region 419 fills, for example, the entire space located under insulating trench 411 and separating well 407 from well 401. In the shown example, region 419 has, in top view, a ring shape surrounding well 407.

Regions 417 and 419 respectively have widths L1 and L2. As an example, the widths L1 and L2 of the regions 417 and 419 of device 400 are substantially equal to the width L of the region 129 of device 100.

Although a case where regions 417 and 419 each have a ring shape has been illustrated, regions 417 and/or 419 deprived of portions parallel to the plane AA of FIG. 4A, that is, only comprising separate portions orthogonal to plane AA of FIG. 4A, may as a variant be provided.

The regions 417 and 419 of device 400 are, for example, similar to the region 129 of device 100. As an example, regions 417 and 419 are doped with the second conductivity type (type N, in this example) and each have a doping level substantially equal to that of substrate 101. In this example, regions 417 and 419 each correspond, for example, to a portion of well 415 interposed between well 401, on the one hand, and well 103 or 407, on the other hand, under the central portion of insulating trench 409 or 411.

In device 400, well 103 and region 417 form a heterojunction symbolized, in FIG. 4B, by a diode D3. In the case where well 103 and region 417 are respectively P-type and N-type doped, diode D3 comprise an anode located on the side of well 103 and a cathode located on the side of region 417.

Further, in device 400, well 103 and well 415 form a heterojunction symbolized, in FIG. 4B, by another diode D4. In the case where wells 103 and 415 are respectively P-type and N-type doped, diode D4 comprises an anode located on the side of well 103 and a cathode located on the side of well 415.

Device 400 is equivalent to two diodes assembled in series and interconnected by their cathodes. One of these diodes comprises a P-N heterojunction comprising a region of the first conductivity type (type P, in this example), formed by region 107 and well 103, and a region of the second conductivity type (type N, in this example), formed by well 415. The other diode comprises a P-N heterojunction comprising a region of the first conductivity type (type P, in this example), formed by region 111 and well 407, and a region of the second conductivity type (type N, in this example), formed by well 415.

Generally, the device 400 of FIGS. 4A and 4B has advantages similar to those of the device 100 of FIGS. 1A and 1B. More precisely, the back (or breakdown) voltage of device 400 is, due to the presence of lightly-doped region 417 located between well 103 and the central portion 401C of well 401, advantageously greater than the one that a device similar to device 400 but deprived of region 417, would have, for example, with wells 103 and 401 joining each other.

Figure 4C:
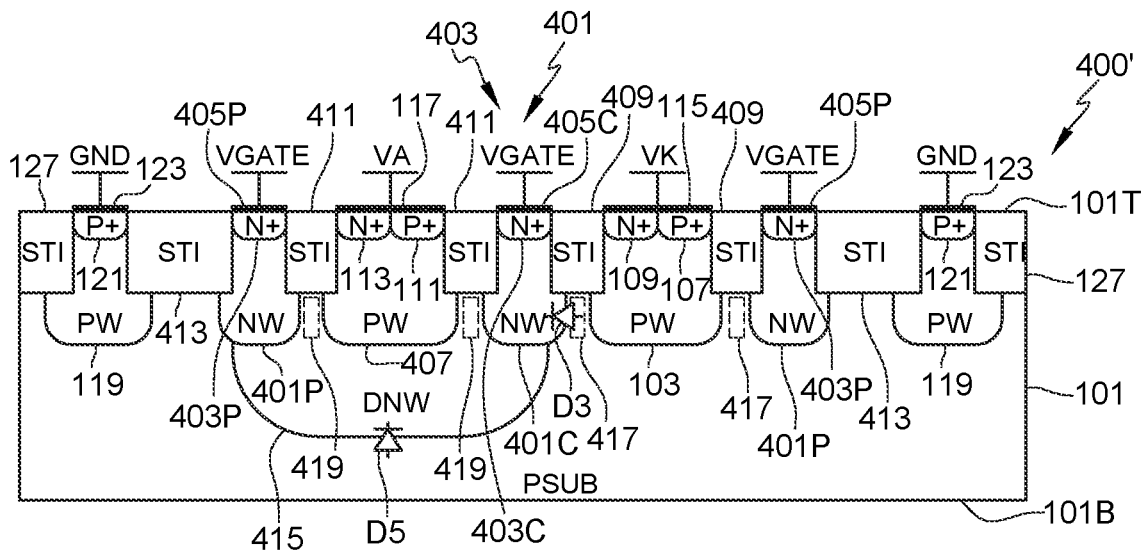
FIG. 4C is a cross-section view, along plane AA of FIG. 4A, of the device of FIG. 4A according to an alternative embodiment.

FIG. 4C is a cross-section view, along plane AA of FIG. 4A, of the device 400 of FIG. 4A according to an alternative embodiment 400'.

The variant 400' of FIG. 4C comprises elements common with the embodiment of the device 400 of FIGS. 4A and 4B. These common elements will not be described again hereafter. The variant 400' of FIG. 4C differs from the embodiment of FIGS. 4A and 4B in that, in the variant 400' of FIG. 4C, well 407 (PW), the central portion 401C of well 401 (NW), and a portion of the peripheral portion 401P of well 401 located close to well 407 are located in well 415 (DNW). However, well 103 (PW) and portions of the peripheral portion 401P of well 401 located close to well 103 are not located in well 415. Generally, as compared with the device 400 of FIGS. 4A and 4B, well 415 is not present on the side of cathode 115.

Variant 400' is, as compared with device 400, deprived of diode D4 and comprises a heterojunction between substrate 101 and region 415 symbolized, in FIG. 4C, by a diode D5.

The device of variant 400' is equivalent to two diodes assembled in series and interconnected by their cathodes. One of these diodes comprises a P-N heterojunction comprising a region of the first conductivity type (type P, in this example), formed by region 107, well 103, and substrate 101, and a region of the second conductivity type (type N, in this example) formed by well 415. The other diode comprises, as in the case of device 400, a P-N heterojunction comprising a region of the first conductivity type (type P, in this example), formed by region 111 and well 407, and a region of the second conductivity type (type N, in this example), formed by well 415.

An advantage of the variant 400' illustrated in FIG. 4C lies in the fact that the absence of well 415 surrounding well 103 enables to create a lightly-doped electric field extension area. This enables device 400' to have a (back, breakdown) turn-on voltage greater than that of device 400, for an equivalent width L1 of region 417.

Figure 5:
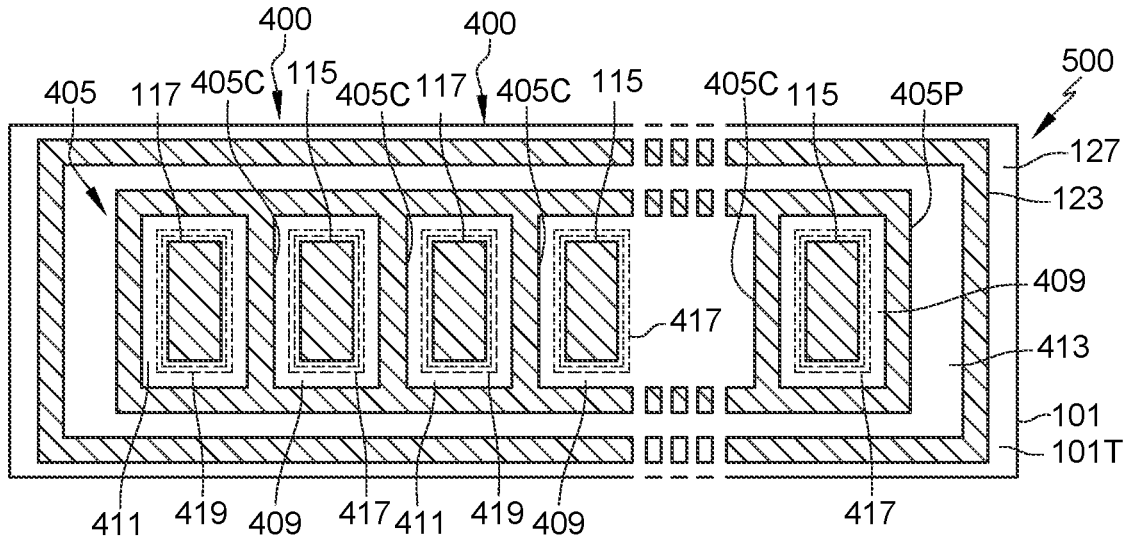
FIG. 5 is a partial simplified top view of a device of protection against electrostatic discharges according to another embodiment.

FIG. 5 is a partial simplified top view of a device 500 of protection against electrostatic discharges according to an embodiment.

In the shown example, device 500 comprises a plurality of devices 400 of the type of FIG. 4B. Device 500 is equivalent to two diodes assembled in series and interconnected by their cathodes forming a triac. Device 500 for example more precisely corresponds to a parallel association of unit devices 400 having their cathodes 115 interconnected, for example, by a same conductive track (not shown in FIG. 5), and having their anodes 117 interconnected, for example, by a same conductive track (not shown in FIG. 5), different from the conductive track interconnecting the cathodes 115 of devices 400.

In the shown example, device 500 comprises an alternation of cathodes 115 and of anodes 117 separated from one another by central portions 405C of electrode 405 and surrounded with the peripheral portion 405P of electrode 405, itself surrounded with peripheral electrode 123. Device 500 for example comprises between two and ten devices 400, for example, approximately five devices 400.

As an example, device 500 has a surface area of approximately 2,700 µm².

As an example, the turn-on voltage of device 500 is, in absolute value and in a case where device 500 comprises five devices 400: in the order of 10 V, in a case where the region 417 of each device 400 has a width equal to approximately 0.26 µm; in the order of 22 V, in a case where the region 417 of each device 400 has a width equal to approximately 1 µm; in the order of 37 V, in a case where the region 417 of each device 400 has a width approximately equal to 1.5 µm; and in the order of 45 V, in a case where the region 417 of each device 400 has a width equal to approximately 2.5 µm.

As a comparison, the back (breakdown) voltage of a device which would have a structure and dimensions similar to those of device 500, but deprived of region 417, would be in the order of 10 V.

An advantage of device 500 lies in the fact that it enables, for a substantially equivalent turn-on voltage, to decrease by approximately 20% the occupied surface area with respect to one or a plurality of devices assembled in series which would have a structure similar to that of device 500 but which would be deprived of region 417.

The turn-on voltage of device 500 is substantially proportional to the width of the region 417 of each device 400. It is thus advantageously possible to adjust the width of each region 417 according to the turn-on voltage desired for device 500.

Although a case where device 500 comprises devices 400 has been illustrated, it is possible, as a variant, to provide a device 500 comprising a plurality of devices 400'.

Figure 6:
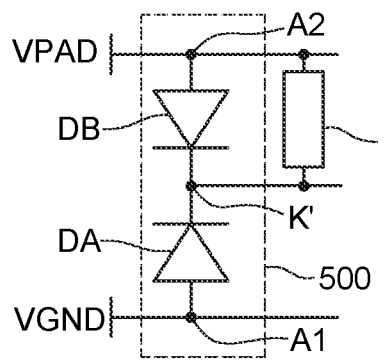
FIG. 6 is an electric diagram equivalent to the device of FIG. 5.

FIG. 6 is an electric diagram equivalent to the device 500 of FIG. 5.

Device 500 is, in FIG. 6, symbolized by two diodes DA and DB associated in series and interconnected by their cathodes at a node K', thus forming a triac. Diode DA is substantially equivalent to a parallel association of the diodes D3 of the devices 400 comprised in device 500. Diode DB is substantially equivalent to a parallel association of diodes comprising, in each device 400, a heterojunction between wells 407 and 415. Diode DA comprises an anode A1 for example corresponding to a conductive track interconnecting all the electrodes 115 of the devices 400 of device 500, and a cathode connected to node K' and for example corresponding to the electrode 405 of device 500. Further, diode DB comprises an anode A2 for example corresponding to a conductive track interconnecting all the electrodes 117 of the devices 400 of device 500 and a cathode connected to node K' and for example corresponding to the electrode 405 of device 500.

In the shown example, the anode A2 of diode DB is taken to bias potential VPAD. Potential VPAD for example corresponds to a power supply potential of an integrated circuit (not shown in FIG. 6) having a pad coupled or connected to the anode A2 of the diode DB of device 500. In the shown example, a resistor R is connected between the anode A2 and the cathode K' of diode DB.

The potentials VPAD and VGND of FIG. 6 are for example respectively equivalent to the potentials VA and VK of FIGS. 4B and 4C. Triac 500 is in off mode in case of an electrostatic discharge causing the application of a positive overvoltage between the pad or node of application of potential VPAD and the pad or node of application of potential VGND. However, triac 500 is in on mode in case of an electrostatic discharge causing the application of a positive overvoltage between the pad or node of application of potential VGND and the pad or node of application of potential VPAD.

Figure 7:
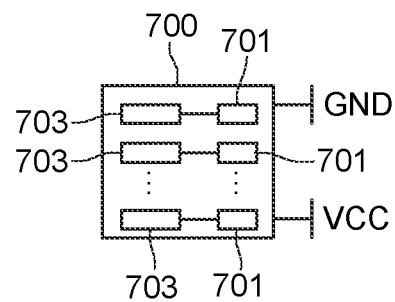
FIG. 7 partially and schematically illustrates a chip integrating devices of protection against electrostatic discharges.

FIG. 7 partially and schematically illustrates an integrated circuit chip 700 comprising devices 701 of protection against electrostatic discharges.

Devices 701 are, for example, of the type of the device 200 of FIG. 2 or of the type of the device 500 of FIG. 5. In the shown example, each device 701 is connected to a component, for example, a capacitive component, or to a pad of chip 700 symbolized in FIG. 7 by a rectangle 703.

In the shown example, chip 700 is powered with a voltage VCC, for example in the order of a several tens of volts, referenced with respect to a reference voltage, here ground GND. Devices 701 enable to avoid for the components or pads 703 to be damaged in case of an electrostatic discharge.

As an example, voltage VCC is greater than 25 V, preferably in the order of 40 V.

Various embodiments and variants have been described. Those skilled in the art will understand that certain features of these various embodiments and variants may be combined, and other variants will occur to those skilled in the art. In particular, although the case where the first conductivity type is P and the second conductivity type is N has been detailed hereabove, the described embodiments and variants can be transposed by those skilled in the art to the case where the first conductivity type is N and the second conductivity type is P. In this case, potential VPAD should for example have a negative value, for example, smaller than –10 V, for example, smaller than –25 V, for example in the order of –40 V.

Further, those skilled in the art are capable of providing any number of devices 100 in device 200 and nay number of devices 400 and/or of devices 400' in device 500.

Further, although embodiments and variants where two regions 107 and 109 are formed in well 103 or 407 have been illustrated, it may be provided, as a variant, for well 103 or 407 to only comprise a single region, for example, region 109.

Finally, the practical implementation of the described embodiments and variants is within the abilities of those skilled in the art based on the functional indications given hereabove. In particular, those skilled in the art are capable of providing the values of the doping levels of substrate 101, of wells 103, 105, 119, 401, 407, and 415, as well as of regions 107, 109, 111, 113, 121, 403, 129, 417, and 419. Those skilled in the art are further capable of adjusting the width of regions 129, 417, and 419 according to the targeted application, particularly according to the turn-on voltage value desired for device 200 or 500.

The invention claimed is:

1. An electronic device, comprising:
   a doped semiconductor substrate of a first conductivity type;
   a first doped well of a second conductivity type opposite to the first conductivity type extending into the doped semiconductor substrate;
   a second doped well of the first conductivity type extending into the first doped well and having a doping level higher than a doping level of the doped semiconductor substrate;
   at least one first region located in the second doped well and having a doping level higher than the doping level of the second doped well and coupled, preferably connected, to a first electrode of the electronic device;
   a third doped well of the second conductivity type extending into the first doped well and having a doping level higher than the doping level of the doped semiconductor substrate;
   a second region located in the third doped well and having a doping level higher than the doping level of the third doped well and coupled, preferably connected, a control electrode of the electronic device;
   a fourth doped well of the first conductivity type extending into the first doped well and having a doping level higher than the doping level of the doped semiconductor substrate;
   at least one third region located in the fourth doped well and having a doping level higher than the doping level of the fourth doped well and coupled, preferably connected, to a second electrode of the electronic device;
   an insulating trench penetrating into the first, second, third and fourth doped wells and extending laterally between said at least one first region and said second region and extending laterally between said second region and said at least one third region;
   a fourth region within the first doped well and laterally extending between the second and third doped wells under the insulating trench, said fourth region having a doping level lower than the doping level of the second and third doped wells; and
   a fifth region within the first doped well and laterally extending between the third and fourth doped wells under the insulating trench, said fifth region having a doping level lower than the doping level of the third and fourth doped wells.

2. The device according to claim 1, wherein the fourth and fifth regions each vertically extend in the first doped well, from a bottom of the insulating trench, down to a depth substantially equal to a depth of the second, third and fourth doped wells.

3. The device according to claim 2, wherein the fourth and fifth regions each have a width in a range from 0.26 to 2.5 μm, preferably in the range from 1 to 1.5 μm, more preferably in the order of 1.35 μm.

4. The device according to claim 1, comprising exactly two first regions respectively of the first and second conductivity type located in the second doped well.

5. The device according to claim 1, comprising exactly two third regions respectively of the first and second conductivity type located in the fourth doped well.

6. The device according to claim 1, wherein the second region is of the second conductivity type.

7. The device according to claim 1, wherein the first and second electrodes are conduction electrodes of the device and the control electrode is a gate electrode of the device.

8. The device according to claim 1, wherein the third doped well is positioned between the second and fourth doped wells and further extends to surround the second and fourth doped wells.

9. The device according to claim 8, wherein a portion of the third doped well is in contact with the doped semiconductor substrate.

10. The device according to claim 1, further comprising:
    a peripheral doped well of the first conductivity type extending into the doped semiconductor substrate and having a doping level higher than the doping level of the doped semiconductor substrate; and
    a peripheral doped region of the first conductivity type located in the peripheral doped well and having a doping level higher than the doping level of the peripheral doped well and connected to a third electrode of application of a reference potential.

11. A device of protection against electrostatic discharges comprising one or a plurality of electronic devices according to claim 1.

12. An integrated circuit chip comprising one or a plurality of elements, wherein each element is associated with at least one device of protection according to claim 11.

13. The integrated circuit chip according to claim 12, having a power supply voltage greater than 25 V, preferably in the order of 40 V.

14. An electronic device, comprising:
    a doped semiconductor substrate of a first conductivity type;
    a first doped well of a second conductivity type opposite to the first conductivity type extending into the doped semiconductor substrate;

a second doped well of the first conductivity type extending into the doped semiconductor substrate and having a doping level higher than a doping level of the doped semiconductor substrate;

at least one first region located in the second doped well and having a doping level higher than the doping level of the second doped well and coupled, preferably connected, to a first electrode of the electronic device;

a third doped well of the second conductivity type extending into the first doped well and having a doping level higher than the doping level of the doped semiconductor substrate;

a second region located in the third doped well and having a doping level higher than the doping level of the third doped well and coupled, preferably connected, a control electrode of the electronic device;

a fourth doped well of the first conductivity type extending into the first doped well and having a doping level higher than the doping level of the doped semiconductor substrate;

at least one third region located in the fourth doped well and having a doping level higher than the doping level of the fourth doped well and coupled, preferably connected, to a second electrode of the electronic device;

an insulating trench penetrating into the doped semiconductor substrate and the first, second, third and fourth doped wells and extending laterally between said at least one first region and said second region and extending laterally between said second region and said at least one third region;

a fourth region within the doped semiconductor substrate and laterally extending between the second and third doped wells under the insulating trench, said fourth region having a doping level lower than the doping level of the second and third doped wells; and a fifth region within the first doped well and laterally extending between the third and fourth doped wells under the insulating trench, said fifth region having a doping level lower than the doping level of the third and fourth doped wells.

15. The device according to claim 14, wherein:

the fourth region vertically extends in the doped semiconductor substrate from a bottom of the insulating trench, down to a depth substantially equal to a depth of the second, third and fourth doped wells; and the fifth region vertically extends in the first doped well, from the bottom of the insulating trench, down to a depth substantially equal to a depth of the second, third and fourth doped wells.

16. The device according to claim 15, wherein the fourth and fifth regions each have a width in a range from 0.26 to 2.5 µm, preferably in the range from 1 to 1.5 µm, more preferably in the order of 1.35 µm.

17. The device according to claim 14, comprising exactly two first regions respectively of the first and second conductivity type located in the second doped well.

18. The device according to claim 14, comprising exactly two third regions respectively of the first and second conductivity type located in the fourth doped well.

19. The device according to claim 14, wherein the second region is of the second conductivity type.

20. The device according to claim 14, wherein the first and second electrodes are conduction electrodes of the device and the control electrode is a gate electrode of the device.

21. The device according to claim 14, wherein the third doped well is positioned between the second and fourth doped wells and further extends to surround the second and fourth doped wells.

22. The device according to claim 21, wherein a portion of the third doped well is in contact with the doped semiconductor substrate.

23. The device according to claim 14, further comprising:
a peripheral doped well of the first conductivity type extending into the doped semiconductor substrate and having a doping level higher than the doping level of the doped semiconductor substrate; and
a peripheral doped region of the first conductivity type located in the peripheral doped well and having a doping level higher than the doping level of the peripheral doped well and connected to a third electrode of application of a reference potential.

24. A device of protection against electrostatic discharges comprising one or a plurality of electronic devices according to claim 14.

25. An integrated circuit chip comprising one or a plurality of elements, wherein each element is associated with at least one device of protection according to claim 24.

26. The integrated circuit chip according to claim 25, having a power supply voltage greater than 25 V, preferably in the order of 40 V.

* * * * *